US012744401B2

(12) United States Patent
Yamamoto et al.

(10) Patent No.: US 12,744,401 B2
(45) Date of Patent: Sep. 22, 2026

(54) INFORMATION PROCESSING DEVICE, INFORMATION PROCESSING METHOD, COMPUTER PROGRAM PRODUCT, AND INFORMATION PROCESSING SYSTEM

(71) Applicant: KABUSHIKI KAISHA TOSHIBA, Tokyo (JP)

(72) Inventors: Takahiro Yamamoto, Tokyo (JP); Kohei Maruchi, Tokyo (JP); Hisaaki Hatano, Yokohama Kanagawa (JP)

(73) Assignee: KABUSHIKI KAISHA TOSHIBA, Kawasaki (JP)

( * ) Notice: Subject to any disclaimer, the term of this patent is extended or adjusted under 35 U.S.C. 154(b) by 389 days.

(21) Appl. No.: 18/456,590

(22) Filed: Aug. 28, 2023

(65) Prior Publication Data

US 2024/0195198 A1 Jun. 13, 2024

(30) Foreign Application Priority Data

Dec. 9, 2022 (JP) ................................ 2022-197110

(51) Int. Cl.
*H02J 7/84* (2026.01)
*G01R 31/36* (2020.01)
*G01R 31/387* (2019.01)
*G01R 31/392* (2019.01)

(52) U.S. Cl.
CPC ............ *H02J 7/84* (2026.01); *G01R 31/3648* (2013.01); *G01R 31/387* (2019.01); *G01R 31/392* (2019.01)

(58) Field of Classification Search
CPC ... H02J 7/005; G01R 31/3648; G01R 31/387; G01R 31/392
See application file for complete search history.

(56) References Cited

U.S. PATENT DOCUMENTS 9,255,971 B2 * 2/2016 Hu ..................... G01R 31/3835
11,112,462 B2 * 9/2021 Makam ................ G01R 31/392
2015/0207355 A1 7/2015 Taylor et al.
2017/0003351 A1 * 1/2017 Mayr .................. G01R 31/382
2017/0031404 A1 2/2017 Yamamoto et al.
2018/0088181 A1 3/2018 Jiang et al.
(Continued)

FOREIGN PATENT DOCUMENTS

EP 4 123 322 A1 1/2023
JP 2016-48617 A 4/2016
(Continued)

OTHER PUBLICATIONS

Japan Patent Office, Office Action in JP App. No. 2022-197110 (Jul. 15, 2025).

*Primary Examiner* — Andrew Schechter
*Assistant Examiner* — Kaleria Knox
(74) *Attorney, Agent, or Firm* — Finnegan, Henderson, Farabow, Garrett & Dunner, LLP

(57) ABSTRACT

According to an embodiment, an information processing device includes one or more processors configured to: analyze operation data of a battery and calculate feature information indicating a feature of charging/discharging by the battery; select, in accordance with the feature information, an estimation method among a plurality of estimation methods for estimating a state of the battery from the operation data; and estimate the state from the operation data using the selected estimation method.

16 Claims, 11 Drawing Sheets

(56) References Cited

U.S. PATENT DOCUMENTS

| | | | | |
|---|---|---|---|---|
| 2020/0003839 | A1 | 1/2020 | Yamamoto et al. | |
| 2020/0011932 | A1* | 1/2020 | Hooshmand | H01M 10/482 |
| 2020/0185958 | A1* | 6/2020 | Kim | F24F 11/47 |
| 2020/0233037 | A1 | 7/2020 | Yamamoto et al. | |
| 2021/0318388 | A1* | 10/2021 | Bae | G01R 31/392 |
| 2022/0170993 | A1* | 6/2022 | Woll | G01R 31/392 |
| 2022/0271537 | A1* | 8/2022 | Mikhaylik | H01M 10/441 |
| 2023/0213585 | A1* | 7/2023 | Shimawaki | G06N 20/00 702/63 |

FOREIGN PATENT DOCUMENTS

| | | | |
|---|---|---|---|
| JP | 2016048617 | A * | 4/2016 |
| JP | 2017-509867 | A | 4/2017 |
| JP | 2017-111860 | A | 6/2017 |
| JP | 2017-190274 | A | 10/2017 |
| JP | 6313502 | B2 | 4/2018 |
| JP | 2020-119712 | A | 8/2020 |
| JP | 6759466 | B2 | 9/2020 |
| WO | WO 2021/186512 | A1 | 9/2021 |
| WO | WO 2021/241115 | A1 | 12/2021 |
| WO | WO 2023/181111 | A1 | 9/2023 |

* cited by examiner

MODULE
BATTERY UNIT
31
32
33
BMU

| TIME | STATE OF CHARGE (SoC) | VOLTAGE [V] | CURRENT [A] | TEMPERATURE [℃] |
|---|---|---|---|---|
| t1 | Q1 | V1 | C1 | T1 |
| t2 | Q2 | V2 | C2 | T2 |
| t3 | Q3 | V3 | C3 | T3 |
| ... | ... | ... | ... | ... |
| ti | Qi | Vi | Ci | Ti |
| ... | ... | ... | ... | ... |

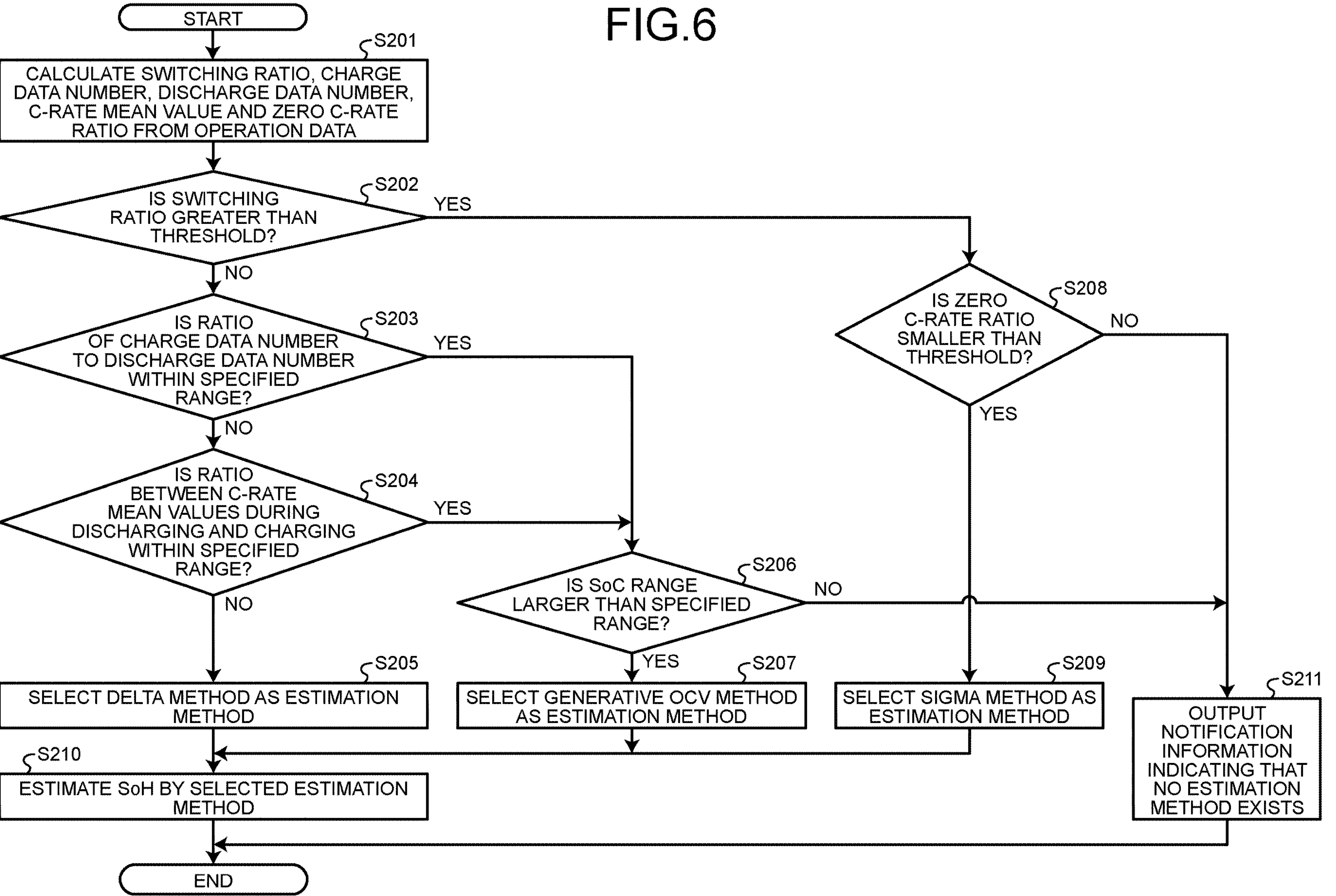

FIG.6
START
S201
CALCULATE SWITCHING RATIO, CHARGE DATA NUMBER, DISCHARGE DATA NUMBER, C-RATE MEAN VALUE AND ZERO C-RATE RATIO FROM OPERATION DATA
S202
IS SWITCHING RATIO GREATER THAN THRESHOLD?
YES
NO
S203
IS RATIO OF CHARGE DATA NUMBER TO DISCHARGE DATA NUMBER WITHIN SPECIFIED RANGE?
YES
NO
S204
IS RATIO BETWEEN C-RATE MEAN VALUES DURING DISCHARGING AND CHARGING WITHIN SPECIFIED RANGE?
YES
NO
S208
IS ZERO C-RATE RATIO SMALLER THAN THRESHOLD?
NO
YES
S206
IS SoC RANGE LARGER THAN SPECIFIED RANGE?
NO
YES
S205
SELECT DELTA METHOD AS ESTIMATION METHOD
S207
SELECT GENERATIVE OCV METHOD AS ESTIMATION METHOD
S209
SELECT SIGMA METHOD AS ESTIMATION METHOD
S211
OUTPUT NOTIFICATION INFORMATION INDICATING THAT NO ESTIMATION METHOD EXISTS
S210
ESTIMATE SoH BY SELECTED ESTIMATION METHOD
END

FIG.8
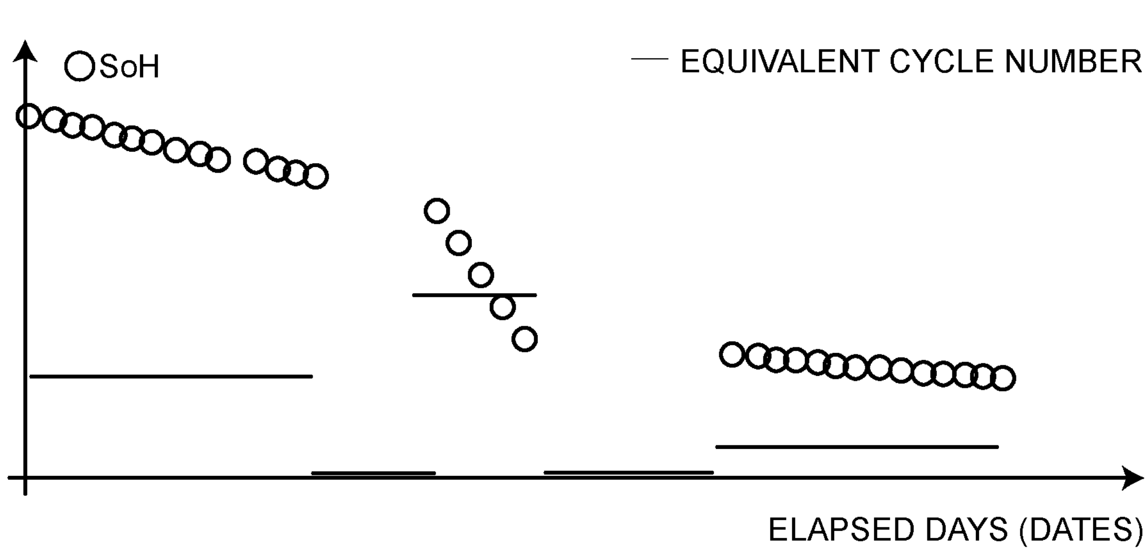
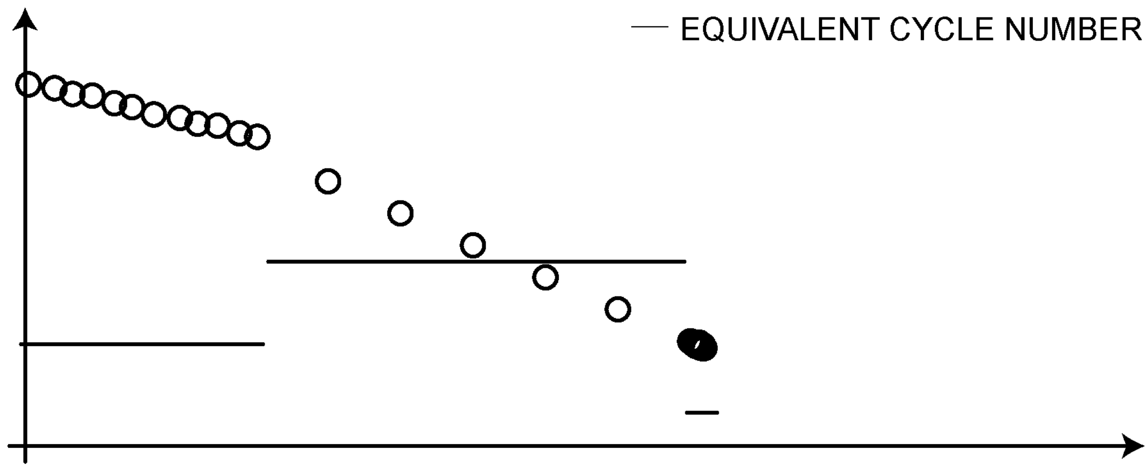

USAGE (U1)
USAGE (U2)
USAGE (U3)
ELAPSED DAYS (DATES)

FIG.10
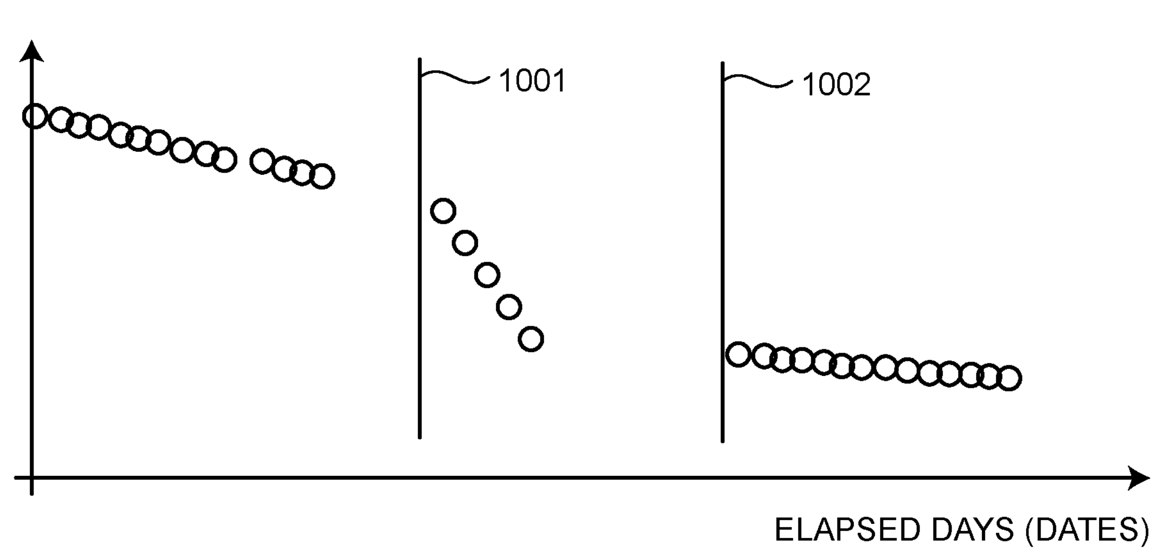
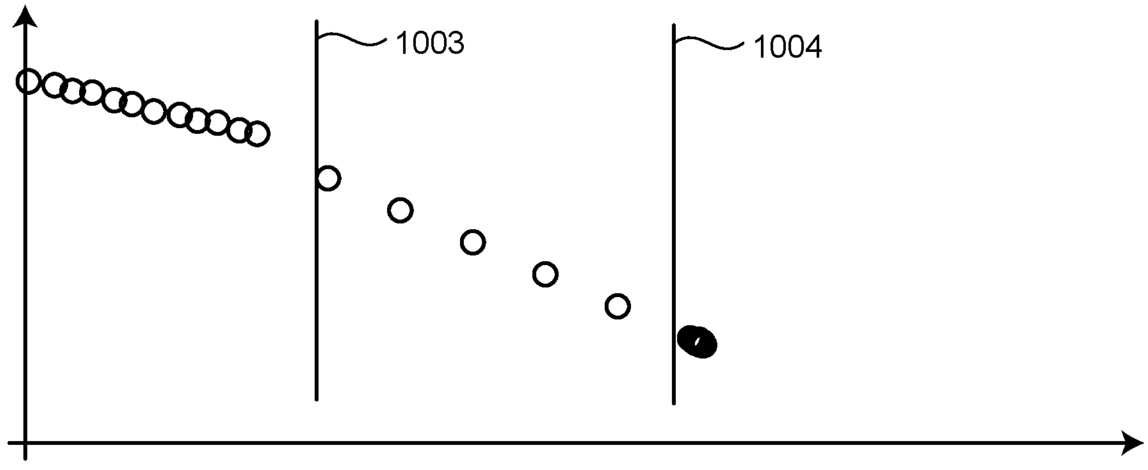

FIG.11
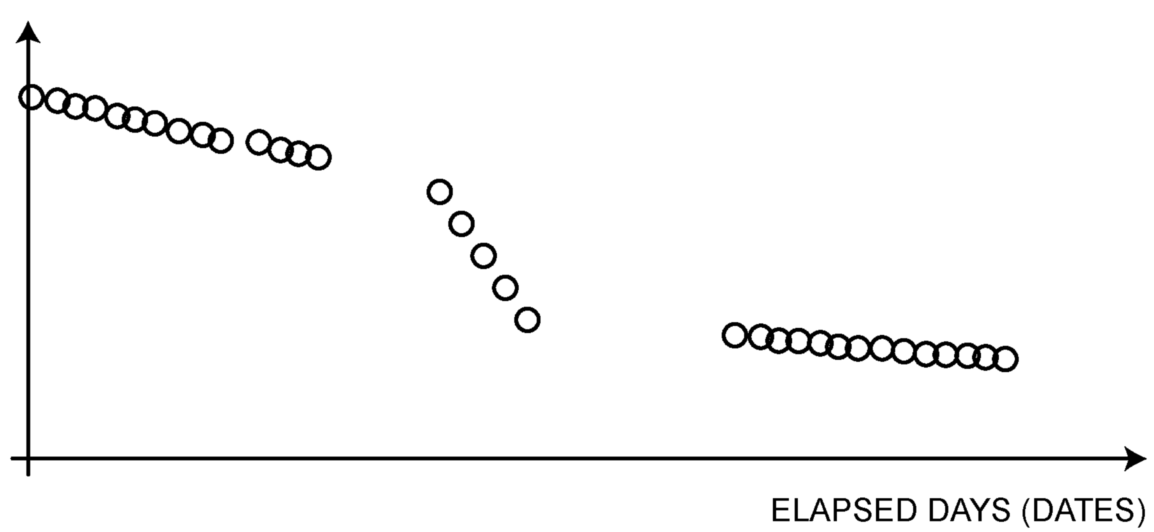
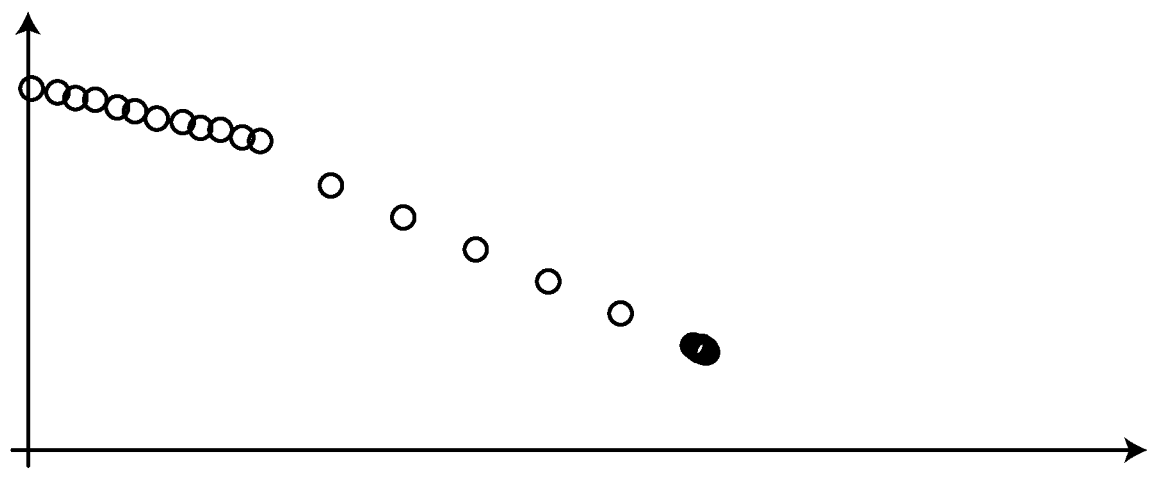

INFORMATION PROCESSING DEVICE, INFORMATION PROCESSING METHOD, COMPUTER PROGRAM PRODUCT, AND INFORMATION PROCESSING SYSTEM

CROSS-REFERENCE TO RELATED APPLICATIONS

This application is based upon and claims the benefit of priority from Japanese Patent Application No. 2022-197110, filed on Dec. 9, 2022; the entire contents of which are incorporated herein by reference.

FIELD

An embodiment described herein generally relates to an information processing device, an information processing method, a computer program product, and an information processing system.

BACKGROUND

In order to improve power quality such as stabilization of power supplied from a power system and suppression of frequency fluctuations in the power system, and also to supply power to electric vehicles (EVs, electric moving bodies), industrial devices, and the like, battery systems are used. In addition, there are proposed technologies that estimate (evaluate) and continuously monitor the state of a battery system (state of health, degradation state, and the like) without stopping operation of the battery system.

In the various usages described above, optimal estimation methods (estimation algorithms) for estimating the state may vary. Therefore, it is desirable to select an estimation method in accordance with the usage.

BRIEF DESCRIPTION OF THE DRAWINGS

FIG. 6 is a flowchart illustrating state of health estimation processing according to the present embodiment;

FIG. 8 is a diagram illustrating examples of a graph representing changes in the state of health;

FIG. 10 is a diagram illustrating examples of a graph representing changes in the state of health;

FIG. 11 is a diagram illustrating examples of a graph representing changes in the state of health.

DETAILED DESCRIPTION

Figure 1:
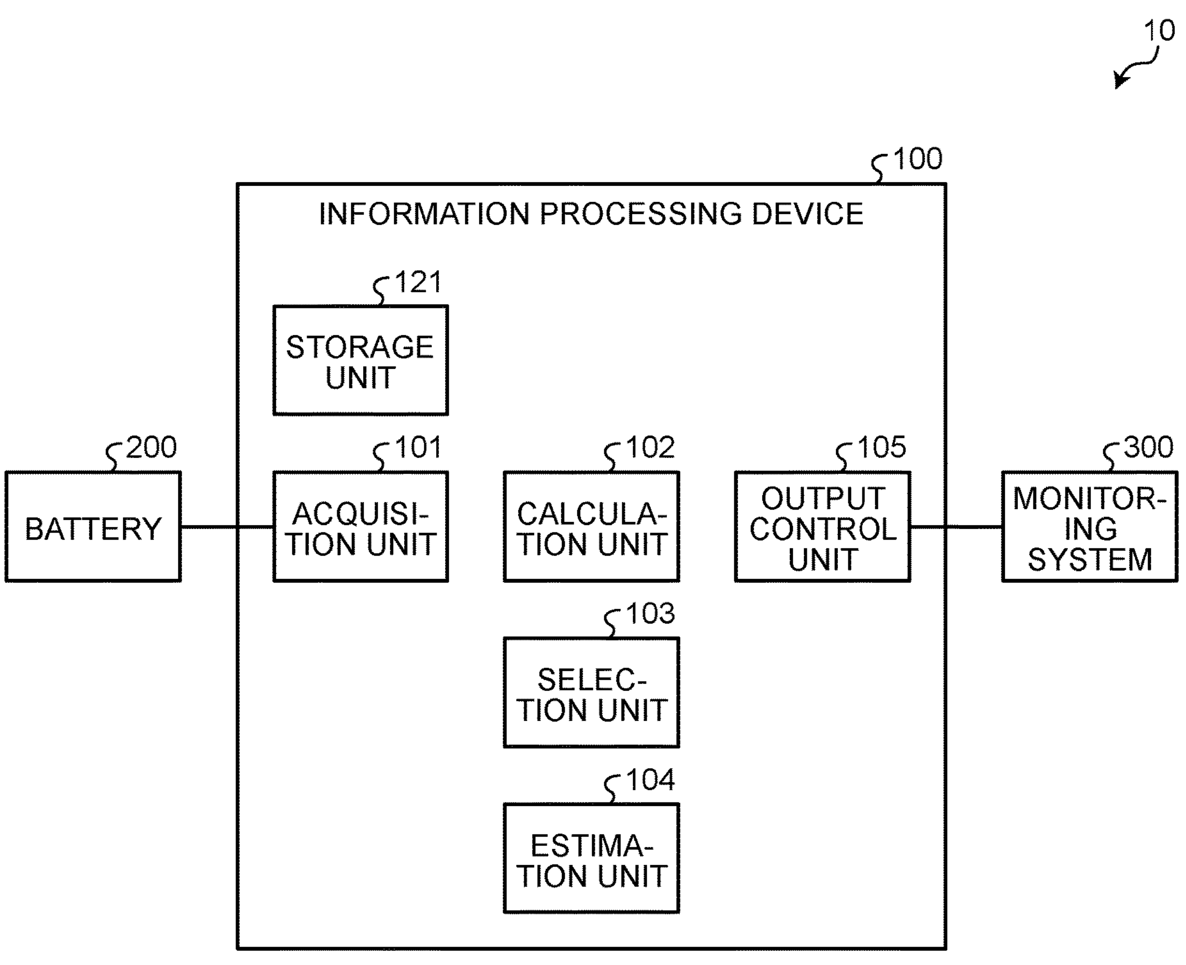
FIG. 1 is a block diagram of an information processing system according to an embodiment.

According to an embodiment, an information processing device includes one or more processors configured to:

analyze operation data of a battery and calculate feature information indicating a feature of charging/discharging by the battery; select, in accordance with the feature information, an estimation method among a plurality of estimation methods for estimating a state of the battery from the operation data; and estimate the state from the operation data using the selected estimation method.

With reference to the accompanying drawings, a preferable embodiment of an information processing device according to an embodiment will be described in detail hereinafter.

Hereinafter, an example of estimating, as the state of a battery system, the state of health (SoH) of batteries (battery components) configuring the battery system will mainly be described. The state of the battery to be the estimation target is not limited to the state of health, but may be any other information such as the amount of power charged and discharged or the temperature of battery cells.

In accordance with the Sustainable Development Goals (SDGs), carbon neutral enforcement, and circular economy trends, it is desired to safely operate battery systems for longer periods of time. To ensure the long-term operation of a battery system, it is necessary to estimate the state of health of the battery system and properly replace and maintain the battery components that can no longer meet battery system specifications. A removed battery component is reinserted into a battery system for a different usage, and used until the component becomes unable to meet the specifications. When there is no more battery system that meets the specifications (usages) of the deteriorating battery component, the battery component is discarded. In this process, it is necessary to continuously monitor the state of health in a unit of a battery component.

It is also desired to estimate the state of health of various battery systems for different usages as described above from data in operation without stopping the operation. In this way, SoH can be estimated when operation data is available and, moreover, a method is considered to select an appropriate estimation method of the state of health in accordance with the usage by using tag information indicating the usage designated in advance by a user or the like. However, with such a method, it is necessary to redesignate the tag information in a case where the battery component is reinserted to a battery system for a different usage or the like, as described above, for example.

In the present embodiment, the operation data acquired from the battery is analyzed, and an appropriate estimation method of the state of health is selected according to the result of the analysis. This makes it possible to efficiently select the appropriate estimation method of the battery state in accordance with the usage. Furthermore, in the present embodiment, by managing the state of health of each battery component, the state of health is continuously monitored on a unit of battery component by tracking the history even when the usage or configuration of the battery system changes. This allows the battery component to be used up until there are no more battery systems with the available specifications (usages).

FIG. 1 is a block diagram illustrating an example of the configuration of an information processing system 10 according to the present embodiment. As illustrated in FIG. 1, the information processing system 10 includes an information processing device 100, a battery 200, and a monitoring system 300.

The information processing device 100 and the battery 200 as well as the information processing device 100 and the monitoring system 300 are connected via a network. The network connecting the information processing device 100 and the battery 200, and the network connecting the information processing device 100 and the monitoring system 300 may be the same network or different networks. The network may be a wireless network, a wired network, or a mixture of wireless and wired networks.

The battery 200 is a battery that can charge and discharge electrical energy. The battery 200 may be in any configuration as long as it is capable of acquiring operation data for estimating the state of health. Operation data is, for example, voltage, current, temperature, and humidity for each parallel circuit configuring the battery 200.

The battery 200 may be a battery loaded on a moving body that operates using electrical energy as a power source. The moving body may be, for example, an electric vehicle (EV), an electric bus, a train, a next-generation tram system (LRT), a bus rapid transit system (BRT), an automated guided vehicle (AGV), an airplane, and a ship. The battery 200 may also be a battery component loaded on an electrical device (a smartphone, a personal computer, or the like), a battery that puts power in and out for demand response, and the like. The battery 200 may also be a battery for other usages.

The battery 200 is charged by a charger placed at a charging station, on the shoulder of a road, in a parking lot, or the like, or a charger connected to an electrical outlet. The power accumulated in the battery 200 may be capable of being discharged (reverse power flow) to a power system via a charger. A method of transmitting the power from the charger to the battery 200 may be either a contact charging method or a non-contact charging method.

Hereinafter, a configuration example of the battery 200 will be described. The battery 200 is not limited to the configuration example. The battery 200 includes a plurality of battery units. The battery units are connected in series or in parallel. Alternatively, the battery units are connected in series and in parallel. The battery may also be a single battery.

Figure 2:
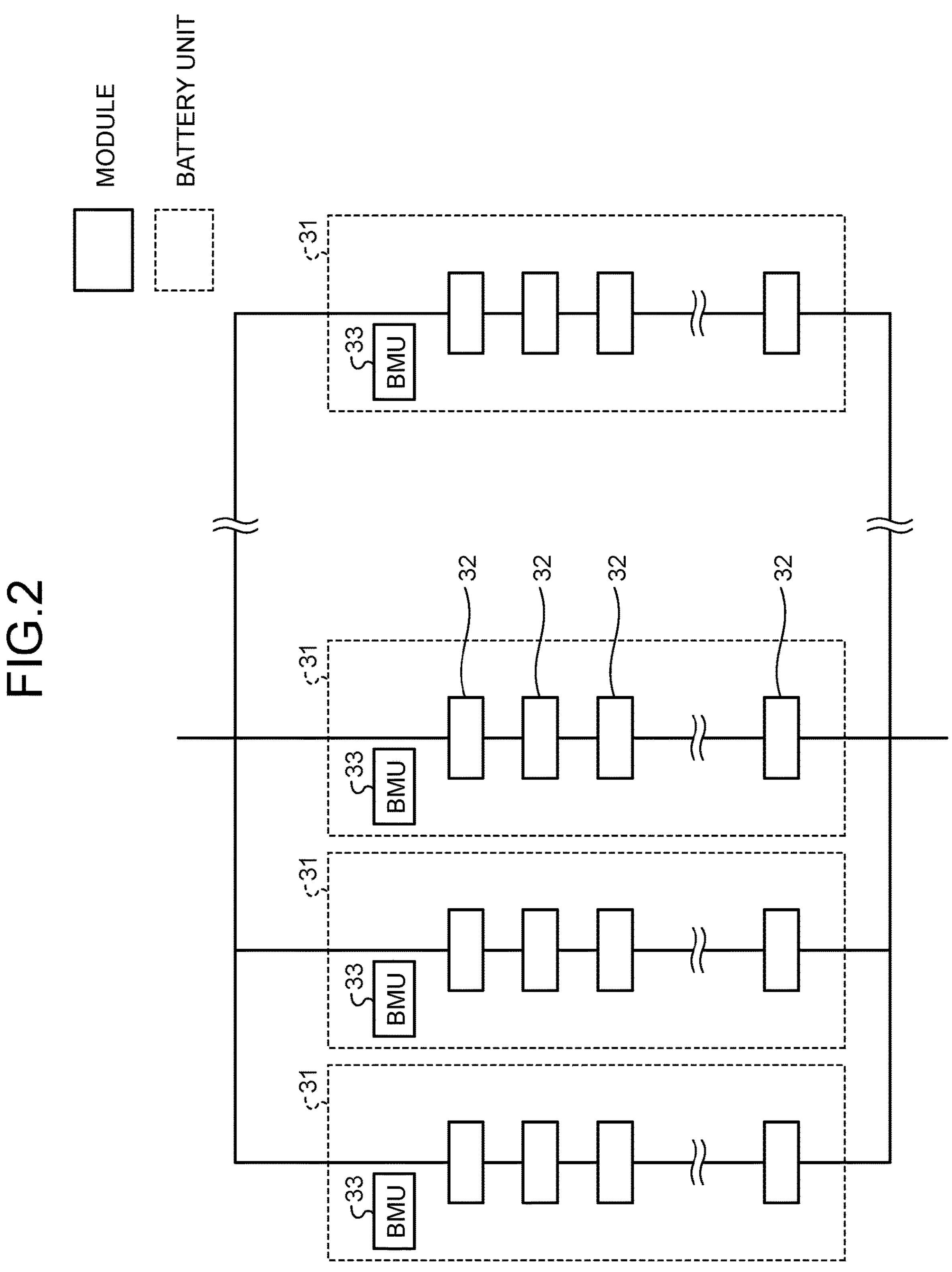
FIG. 2 is a diagram illustrating a configuration example of a battery.

FIG. 2 is a diagram illustrating a configuration example of the battery 200. The battery 200 includes a plurality of battery units 31. Each of the battery units 31 includes a plurality of modules 32 and a battery management unit (BMU) 33. The modules 32 are connected in series, in parallel, or in series and in parallel. While the number of modules provided in each battery unit is the same in the example of FIG. 2, it may not need to be the same.

Figure 3:
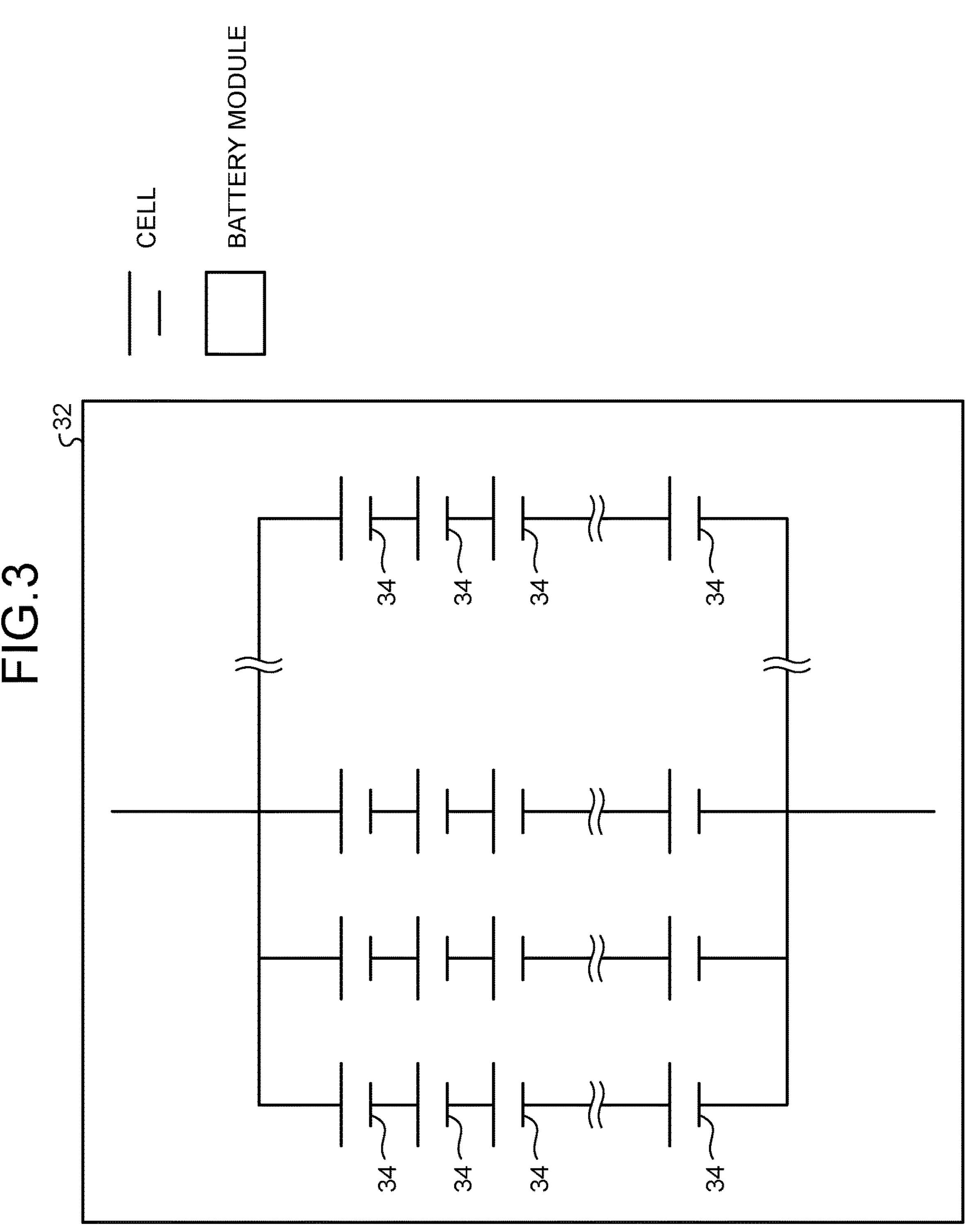
FIG. 3 is a diagram illustrating a configuration example of a module.

FIG. 3 is a diagram illustrating a configuration example of a single module 32. The module includes a plurality of battery cells 34, a temperature sensor, and a cell monitoring unit (CMU). The modules 34 are connected in series, in parallel, or in series and in parallel. In the example of FIG. 3, a plurality of sets each including two or more battery cells 34 connected in series are further connected in parallel.

Returning to FIG. 1, the monitoring system 300 monitors the battery 200 based on information indicating the state of the battery 200 (hereinafter, referred to as state information) that is provided by the information processing device 100. For example, the monitoring system 300 generates screen data to be used for monitoring, and displays the generated screen data on a monitor. The user (supervisor) grasps the state of the battery 200 as a monitoring target by referring to the screen displayed on the monitor. The monitoring system 300 may control the operation of the battery 200 according to the monitoring result or in response to an instruction of the user.

The information processing device 100 includes a storage unit 121, an acquisition unit 101, a calculation unit 102, a selection unit 103, an estimation unit 104, and an output control unit 105.

The storage unit 121 stores therein various kinds of information used in the information processing device 100. For example, the storage unit 121 stores the operation data acquired (input) from the battery 200, the state of health estimated by the estimation unit 104, and the information acquired during estimation (intermediate product).

The storage unit 121 may be configured with any commonly used storage medium such as a flash memory, a memory card, a random access memory (RAM), a hard disk drive (HDD), and an optical disc.

The acquisition unit 101 acquires various kinds of information used in the information processing device 100. For example, the acquisition unit 101 acquires operation data of the battery 200 from the battery 200. Operation data is, for example, time-series data that includes the measurement time (the time at which the data is measured), voltage, and current. Operation data may be acquired at regular time intervals (for example, 1 second) or acquired irregularly. The acquisition unit 101 stores the acquired operation data in the storage unit 121. The unit for acquiring the operation data may be a cell, module, battery unit, or the battery 200 (battery units connected to each other). In the following description, it is assumed that the unit for acquiring the operation data is the battery 200.

Figures 4, 5:
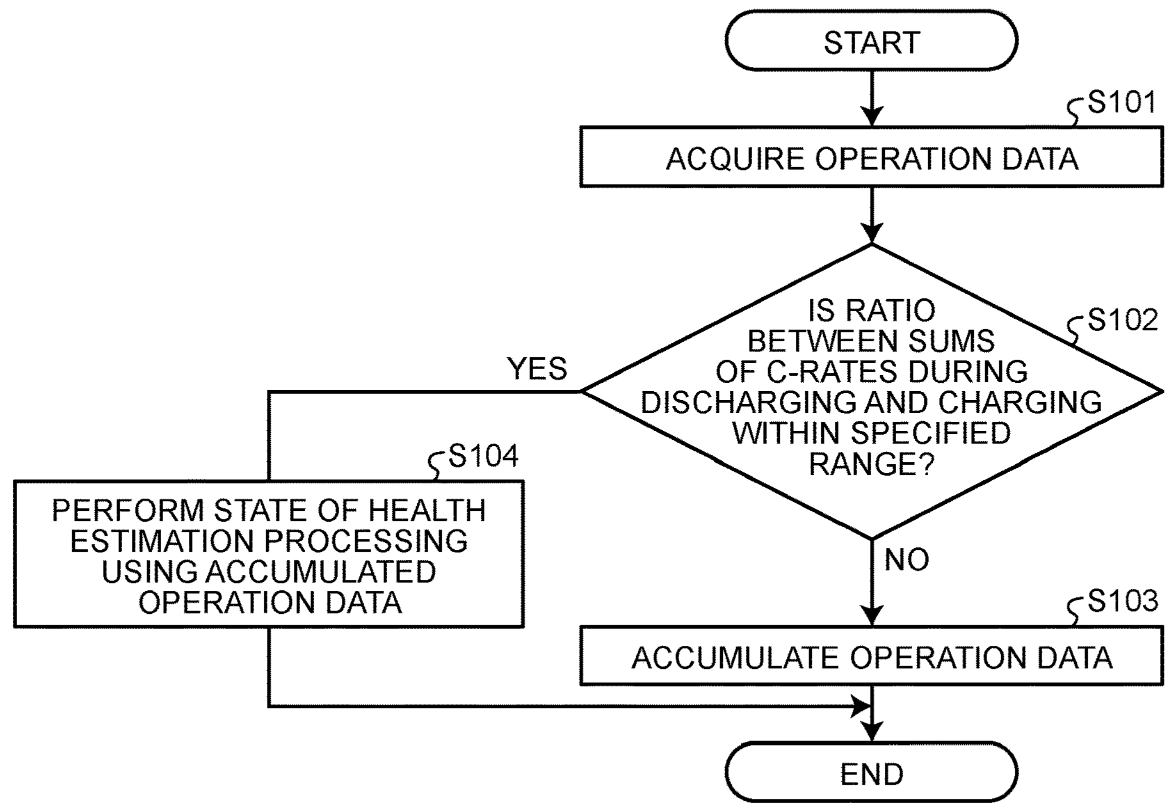
FIG. 4 is a chart illustrating an example of operation data.
FIG. 5 is a flowchart illustrating estimation processing according to the present embodiment.

The operation data includes information regarding, for example, time, state of charge (SoC), voltage, current, and temperature. Information regarding power may be acquired instead of current. In that case, the value of the current may be calculated by an arithmetic operation from the value of the power and the value of the voltage. Note that SoC is an indicator of the state of charge amount of the battery. For example, SoC is calculated by dividing the amount of power (unit is Wh) or amount of electric charge (unit is Ah) accumulated in the battery 200 by the rated capacity (amount of power or amount of electric charge) of the battery 200. FIG. 4 is a chart illustrating an example of the operation data. As illustrated in FIG. 4, the operation data includes information regarding time, SoC, voltage, current, and temperature.

The calculation unit 102 analyzes the operation data of the battery 200, and calculates feature information representing the features of charging/discharging by the battery 200. Note that charging/discharging means at least one of charging and discharging.

The calculation unit 102 calculates part of or all of a plurality of pieces of feature information (F1) to (F3) as follows, for example.

(F1) Mean ratio, which is the ratio of a charging C-rate mean value that is the mean value of C-rates during charging to a discharging C-rate mean value that is the mean value of C-rates during discharging. Note that a C-rate is calculated, for example, by normalizing (dividing) the current value by the rated current value, or by normalizing (dividing) the power value, which is calculated by multiplying voltage and current.

(F2) Data number ratio, which is the ratio of the charge data number as the number of pieces of data of C-rates during charging to the discharge data number as the number of pieces of data of C-rates during discharging.

(F3) Switching ratio that is obtained by dividing the number of switchings between charging and discharging by the number of pieces of operation data.

The calculation unit 102 may perform calculation processing of the feature information as described above when the operation data satisfies a condition defined in advance. The condition defined in advance is, for example, a condition under which operation data capable of calculating the state of health with high precision is acquired, and an example thereof may be as follows.

The C-rate ratio, which is the ratio of the sum of the C-rates during charging and the sum of the C-rates during discharging, is included in a specified range (third specified range).

This condition can be interpreted as a condition indicating that SoC at the time when the acquisition of the operation data is started is approximately the same as SoC at the time when the acquisition of the operation data is ended. This is because when the SoCs at the start and at the end cannot be regarded as the same, an error in estimation of the state of health may be caused since the charge amount or the discharge amount is greater than the other, for example. Alternatively, when the SoCs are different, processing is performed to move the end time forward (or delay the start time) until those become closer.

The calculation unit 102 determines such a condition for a plurality of pieces of operation data as the estimation targets of the state of health and, when the condition is not satisfied, stores and accumulates the pieces of operation data in the storage unit 121. When the condition is satisfied, the calculation unit 102 analyzes the pieces of operation data stored (accumulated) in the storage unit 121 up to that point and calculates the feature information.

The unit of operation data to be the estimation target of the state of health may be, for example, a plurality of pieces of operation data (a plurality of pieces of operation data included in a file output daily, or the like) acquired over a specific period (for example, 1 day), or part of operation data designated from a plurality of pieces of operation data (operation data designated from the operation data within a file, or the like).

The selection unit 103 selects an estimation method in accordance with the feature information among a plurality of estimation methods for estimating the state of the battery 200 from the operation data. As described above, the feature information is information that represents the features of charging/discharging by the battery 200. The features of charging/discharging may vary depending on the usage for which the battery 200 is used. Therefore, selecting an estimation method in accordance with the feature information corresponds to selecting an estimation method of the state of the battery 200 in accordance with the usage.

Examples of the usages of the battery 200 are as follows.

(U1) Stabilization of the voltage supplied by the power system and suppression of frequency fluctuations in the power system.

(U2) Power source for motorized moving bodies and industrial devices (for example, power source for an automobile, a ship, an unmanned vehicle, and a crane used in a port).

(U3) Uninterruptible power supply devices that supplies power to industrial devices and the like.

In a usage such as (U1), the battery 200 is subjected to repeated charging and discharging, resulting in progressive degradation.

In a usage such as (U2), there are such features that large output in a short period of time (cranes and the like); charging at high rate, discharging at low rate, and charging by regeneration (automobiles, ships, and the like); charging/discharging at very low rate for a long period of time (when ships and the like are anchored); and the like.

In a usage such as (U3), the accumulated power is immediately supplied to connected devices upon detecting that the supply from the power system is interrupted. In such a usage, the time for maintaining a fully charged state is long, so that degradation due to storage or float charging progresses in accordance with the length of the fully charged state period.

The degradation of the battery 200 appears in the operation data in accordance with the characteristics of the battery cells and the state of charging/discharging. In other words, feature information obtained by analyzing the operation data fluctuates in accordance with different usages based on the characteristics of the battery cells. Therefore, even when the same battery cells are employed in the battery 200, it is necessary to estimate the state of health using the estimation methods in accordance with the usages.

Therefore, in the present embodiment, the selection unit 103 selects an estimation method in accordance with the feature information among a plurality of estimation methods. This makes it possible to efficiently select an appropriate estimation method of the state of the battery 200 in accordance with the usage.

The estimation methods include, for example, following methods. In all cases, there is a difference in the processing method of voltage data in any given SoC range in the time series data of SoC and voltage.

(M1) A method of estimating the state using the magnitude of voltage fluctuations as the main feature information (a first estimation method, which is referred to as a sigma method hereinafter).

(M2) A method of estimating the state using a difference between the mean value of the voltage during charging and the mean value of the voltage during operation of a device (during discharging) as the main characteristic information (a second estimation method, which is referred to as a delta method hereinafter).

(M3) A method of estimating the state using the mean value of voltage fluctuations as the main feature information (a third estimation method, which is referred to as a generative OCV method hereinafter).

The feature information of the voltage data used in the sigma method is any one selected from root mean square value, standard deviation, variance, or a value calculated based on at least one of those. The sigma method can be achieved, for example, by the technique described in Japanese Patent No. 6313502. The feature information of the voltage data used in the delta method can be achieved, for example, by the technology described in International Publication WO 2021/186512. The generative OCV method can be achieved, for example, by the technology described in Japanese Patent Application Laid-open No. 2020-119712.

For example, the sigma method is suitable for estimating the state of health of the battery 200 for the operation data when used in usages such as (U1) where charging and discharging cycles proceed in a relatively short period of time. The delta method is suitable for the usage where a device is made to operate after charging, as indicated in (U2). The generative OCV method is suitable for the battery with characteristics where the main feature information for degradation appears in the change in OCV, and for a usage such as (U3) where storage or float time becomes a long period of time.

The selection unit 103 selects one of a plurality of estimation methods by determining the conditions for one or more pieces of feature information.

For example, in the usage (U1), the switching ratio becomes large because charging and discharging are repeated in short intervals. Therefore, the selection unit 103 selects the sigma method suitable for the usage (U1), when the condition that the switching ratio in (F3) is greater than a threshold TH_a (first threshold) defined in advance is satisfied.

Furthermore, the usage (U2), for example, corresponds to the condition that the switching ratio in (F3) is equal to or less than the threshold TH_a, the data number ratio in (F2) is outside a specified range R_a (first specified range), and the mean ratio in (F1) is outside a specified range R_b (second specified range). Therefore, the selection unit 103 selects the delta method suitable for the usage (U2) when the condition is satisfied.

Furthermore, the usage (U3), for example, corresponds to the condition that the switching ratio in (F3) is equal to or less than the threshold TH_a, and the data number ratio in (F2) is within the specified range R_a or the mean ratio in (F1) is within the specified range R_b. Therefore, the selection unit 103 selects the generative OCV method suitable for the usage (U3) when the condition is satisfied.

Note that the selection methods described above are examples only, and the selection methods are not limited thereto. Any methods may be used to select one of the estimation methods depending on whether one or more conditions regarding one or more pieces of feature information are satisfied.

The estimation unit 104 estimates the state from the operation data using the estimation method selected by the selection unit 103.

The output control unit 105 controls output of various kinds of information used in the information processing device 100. For example, the output control unit 105 outputs, to the monitoring system 300, the state of health as the estimation result obtained by the estimation unit 104.

When no estimation method corresponding to the feature information is selected by the selection unit 103 (when there is no estimation method that satisfies the condition, or the like), the output control unit 105 may output notification information indicating that no estimation method corresponding to the feature information exists. The output destination of the notification information is, for example, the storage unit 121 or the monitoring system 300.

At least part of the above units (the acquisition unit 101, the calculation unit 102, the selection unit 103, the estimation unit 104, and the output control unit 105) may be achieved by a single processing unit. Each of the above units is achieved by a single or a plurality of processors, for example. For example, each of the above units may be achieved by having a processor such as a central processing unit (CPU) execute a program, that is, by software. Each of the above units may be achieved by a dedicated integrated circuit (IC), that is, by hardware. Each of the above units may be achieved by using a combination of software and hardware. When using a plurality of processors, each of the processors may achieve one of the units or may achieve two or more of the units.

Next, the estimation processing performed by the information processing device 100 according to the present embodiment will be described. FIG. 5 is a flowchart illustrating an example of the estimation processing according to the present embodiment.

The acquisition unit 101 acquires the operation data of the battery 200 (step S101). Although the operation data may be acquired in any unit, the acquisition unit 101 acquires a plurality of pieces of operation data by inputting a file containing the pieces of operation data for each day, for example.

The calculation unit 102 determines whether the acquired pieces of operation data satisfy the condition defined in advance. For example, the calculation unit 102 determines whether the C-rate ratio, which is the ratio of the sum of the C-rates during charging and the sum of the C-rates during discharging, is within the specified range, as described above (step S102).

When the condition is not satisfied (No at step S102), the calculation unit 102 stores the acquired operation data in the storage unit 121 (step S103).

When the condition is satisfied (Yes at step S102), state of health estimation processing using the accumulated operation data is executed (step S104).

The estimated state of health is output to the monitoring system 300, for example. The monitoring system 300, for example, generates and outputs (displays), to the user, a graph representing changes in the state of health. The information processing device 100 may output not only the state of health but also information indicating various intermediate products calculated during estimation of the state of health. The intermediate products are, for example, statistics information (voltage, current, temperature, and the like) contained in the operation data used for the estimation. The monitoring system 300 may also output information regarding the intermediate products along with the state of health.

Next, details of the state of health estimation processing indicated in step S104 of FIG. 5 will be described. FIG. 6 is a flowchart illustrating an example of the state of health estimation processing according to the present embodiment.

The calculation unit 102 calculates the switching ratio, the charge data number, the discharge data number, charging C-rate mean value, discharging C-rate mean value, and zero C-rate ratio from the operation data (step S201).

The number of switchings between charging and discharging is calculated, for example, by the number of times the sign of the product of the current value included in the operation data at a given time (t−1) and the current value included in the operation data at the next time t becomes negative. The switching ratio is calculated by dividing the number of switchings by the number of pieces of operation data.

The zero C-rate ratio is the value obtained by dividing the number of C-rates with the value of zero by the number of pieces of operation data. A C-rate with a value of zero is considered that no charging/discharging is performed. Thus, the zero C-rate ratio can be interpreted as indicating the ratio of operation data when no charging/discharging is performed. The zero C-rate ratio is used to determine whether the operation data is suitable for using the sigma method. When such a determination is not necessary, the zero C-rate ratio may not need to be calculated.

Hereafter, the selection unit 103 selects one of the estimation methods that are the sigma method, the delta method, and the generative OCV method, depending on whether the feature information based on the information calculated at step S201 satisfies the condition (step S202 to step S209).

First, the selection unit 103 determines whether the switching ratio is greater than the threshold TH_a (for example, 0.2) (step S202). When the switching ratio is greater than the threshold TH_a (Yes at step S202), the selection unit 103 determines whether the zero C-rate ratio is smaller than a threshold TH_b (for example, 0.05) defined in advance (step S208).

When the zero C-rate ratio is smaller than the threshold TH_b (Yes at step S208), the selection unit 103 selects the sigma method as the estimation method of the state of health (step S209).

When the switching ratio is equal to or less than the threshold TH_a (No at step S202), the selection unit 103 determines whether the ratio of the charge data number to the discharge data number, that is, the data number ratio, is within the specified range R_a (for example, 0.8 to 1.2) (step S203).

When the data number ratio is not within the specified range R_a (No at step S203), the selection unit 103 determines whether the mean ratio, which is the ratio of the charging C-rate mean value to the discharging C-rate mean value, is within the specified range R_b (for example, 1/5 to 5) (step S204). Note that the condition that the specified range is within 1/5 to 5 can be rephrased as a condition indicating that the larger value out of the charging C-rate mean value and discharging C-rate mean value is five times or less than the smaller value.

When the mean ratio is not within the specified range R_b (No at step S204), the selection unit 103 selects the delta method as the estimation method of the state of health (step S205).

When the data number ratio is within the specified range R_a (Yes at step S203) or when the mean ratio is within the specified range R_b (Yes at step S204), the selection unit 103 determines whether the range of SoC of the operation data (SoC range) is greater than the specified range (step S206). This determination corresponds to determining whether the operation data in the range of SoC required for estimation by the generative OCV method is acquired. For example, the specified range is a range where the SoC is from 70% to 100%.

When the range of the SoC of the operation data is greater than the specified range (Yes at step S206), the selection unit 103 selects the generative OCV method as the estimation method (step S207).

When the zero C-rate ratio is equal to or greater than the threshold TH_b (No at step S208) and when the range of the SoC of the operation data is equal to or less than the specified range (No at step S206), the calculation unit 102 determines that the state of health cannot be estimated. At this time, the output control unit 105 may output notification information indicating that no estimation method corresponding to the feature information exists (step S211). By referring to the notification information, for example, the user can grasp that there is operation data that is not suitable for any of the assumed estimation methods exists.

When an estimation method is selected in step S205, step S207, or step S209, the estimation unit 104 estimates the state of health using the operation data with the selected estimation method (step S210).

As described above, the output control unit 105 may output, for example, information (hereinafter, referred to as output information) for the monitoring system 300 to generate a graph representing changes in the state of health. The output information may include not only output information regarding the battery 200, but also output information regarding the system that uses the battery 200.

In addition to the state of health (SoH) acquired at regular intervals (for example, one day), the output information regarding the battery 200 includes at least part of the following information acquired at regular intervals, for example.

- Equivalent cycle number (the number of times charging/discharging is performed)
- Mean power rate
- Representative temperature
- Charging/discharging efficiency
- Selected estimation method The output information regarding the system that uses the battery 200 includes at least part of the following information acquired at regular intervals, for example.

Figure 7:
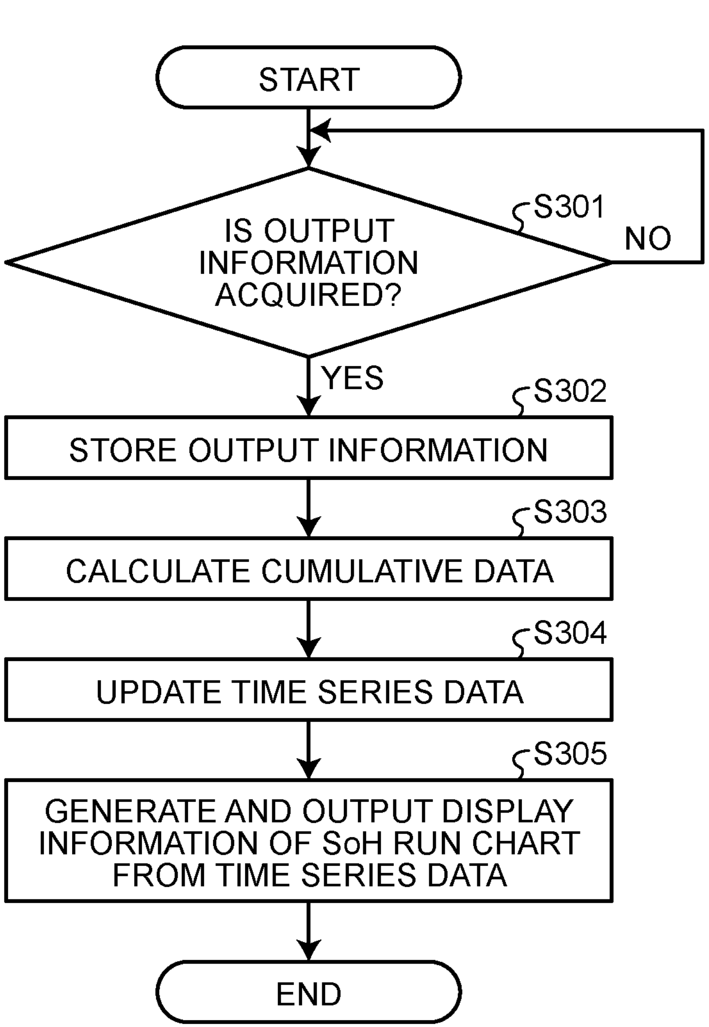
FIG. 7 is a flowchart illustrating output processing according to the present embodiment.

- Temperature
- Humidity
- Moving distance (travel distance, cruising distance, or the like) of the moving body where the battery 200 is loaded
- Operation area
- Sunlight The monitoring system 300 can generate and output (display), to the user, a graph (SoH run chart) indicating changes in the state of health using the output information acquired at regular intervals. FIG. 7 is a flowchart illustrating an example of output processing for generating and outputting the SoH run chart. Note that the output processing may be configured to be executed by the output control unit 105.

The monitoring system 300 determines whether the output information output at regular intervals from the information processing device 100 (the output control unit 105) is acquired (step S301). As described above, the output information may include not only output information regarding the battery 200, but also output information regarding the system that uses the battery 200.

The monitoring system 300 stores the acquired output information in an internally provided storage device, for example (step S302). The monitoring system 300 calculates the cumulative data that is the accumulated values for at least part of the information included in the output information (step S303).

For example, since the equivalent cycle number included in the output information is the value per specific period of time, the monitoring system 300 calculates the cumulative equivalent cycle number, which is the accumulated value of the equivalent cycle number since the start of a service operation, as cumulative data. When the output information includes the traveled distance of a moving body carrying the battery 200, the monitoring system 300 may calculate the accumulated value of the traveled distance as cumulative data.

The monitoring system 300 uses the output information and cumulative data to update the time series data that can be used to generate the SoH run chart (step S304). The monitoring system 300, for example, assigns an operating date to the daily output data and replaces the equivalent cycle number with the cumulative equivalent cycle number to generate the following time series data. {date, state of health, cumulative equivalent cycle number, mean power rate, representative temperature, selected estimation method, information indicating features of the system that uses the battery (travel distance and the like)}

The selected estimation method may be replaced by the corresponding usage (for example, any of (U1) to (U3) described above).

For example, when the user gives an instruction to display a SoH run chart, the monitoring system 300 generates and outputs display information for displaying a SoH run chart indicating changes in the state of health from the generated time series data (step S305). A SoH run chart, for example, is a graph where the horizontal axis represents information indicating the passage of time and the vertical axis represents the state of health (SoH).

Information indicating the passage of time is, for example, the number of days elapsed since the start of service operation or the cumulative equivalent cycle number. When the battery 200 is loaded on a moving body, for example, the accumulated value of the moving distance may be used as the information indicating the passage of time. The use of the number of days elapsed since the start of operation makes it easier to grasp relevancy with events such as reconfiguration of a battery system and changes in the usage. The use of the cumulative equivalent cycle number makes it easier to understand the transition in the state of health with respect to the processed cumulative amount of power, thereby making it possible to predict the transition in the future.

FIG. 8 to FIG. 11 are examples of a SoH run chart. FIG. 8 to FIG. 11 are diagrams illustrating examples of a SoH run chart generated using output information output daily. The upper part of each diagram is an example of a SoH run chart where the horizontal axis represents the number of days elapsed since the start of service operation. The lower part of each diagram is an example of a SoH run chart where the horizontal axis represents the cumulative equivalent cycle number (FIG. 8 to FIG. 10) or the cumulative moving distance (FIG. 11). The dots (circles) in each diagram indicate values of the estimated state of health (SoH).

The horizontal lines in FIG. 8 represent the equivalent cycle number per specific period. While the equivalent cycle number is not indicated in FIG. 9 to FIG. 11, the equivalent cycle number may also be indicated therein as in FIG. 8.

Figure 9:
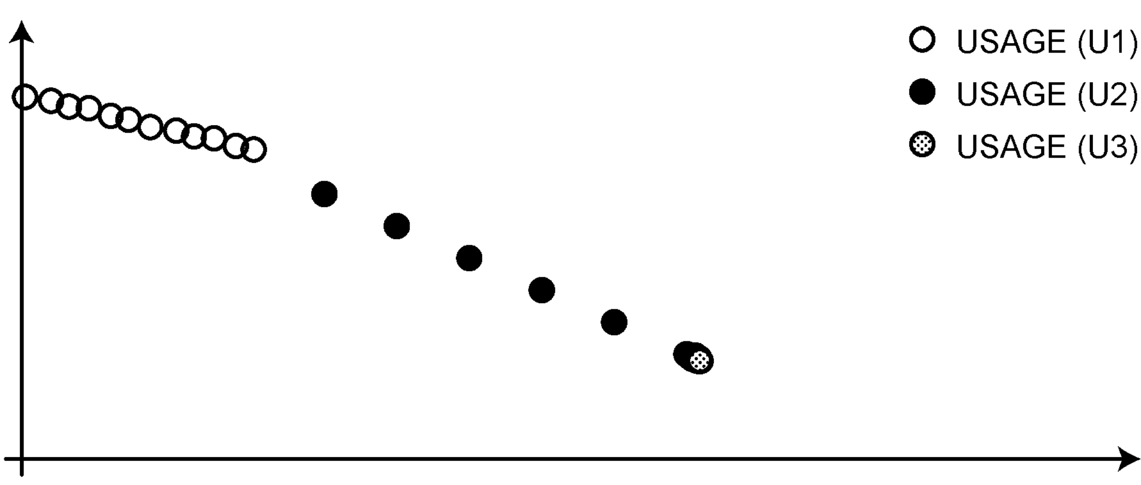
FIG. 9 is a diagram illustrating examples of a graph representing changes in the state of health.

In the SoH run chart, output information indicating the estimated usage may also be output along with the state of health. For example, FIG. 9 indicates an example where dots are displayed in different modes for each "usage" replaced from the selected estimation method. The display modes are, for example, shapes and colors. In FIG. 9, for example, white circles correspond to the usage of (U1), black circles to the usage of (U2), and hatched circles to the usage of (U3).

FIG. 10 indicates examples of a SoH run chart that includes lines 1001 to 1004, which represent the points when the usage is changed. Along with the lines, information (text data or the like) indicating how the usage is changed may be displayed as well.

This allows the user to visually recognize from the SoH run chart when and for which usage it is used. In the example in FIG. 9, it can be observed that the usage of a given battery changed in the order of (U1), (U2), and (U3).

In order to grasp the state where the battery is in, one of or both of the mean power rate and representative temperature may be added to the vertical axis of the run chart.

As described above, the information processing device according to the present embodiment can estimate the state of health of the battery 200 by the estimation method corresponding to a plurality of pieces of feature information obtained by analyzing the operation data of the battery 200. This makes it possible to efficiently select an appropriate estimation method of the state of the battery 200 in accordance with the usage.

According to the present embodiment, when the usage of the battery 200 is changed, for example, the state of health can be estimated by analyzing the operation data continuously acquired from the battery 200 and selecting the estimation method suitable for the usage without explicitly designating the change of the usage. Thus, for example, even when a given battery 200 is switched and used in a battery system for a different usage, it is possible to continue monitoring of the state of health with that battery 200 being a unit.

Figure 12:
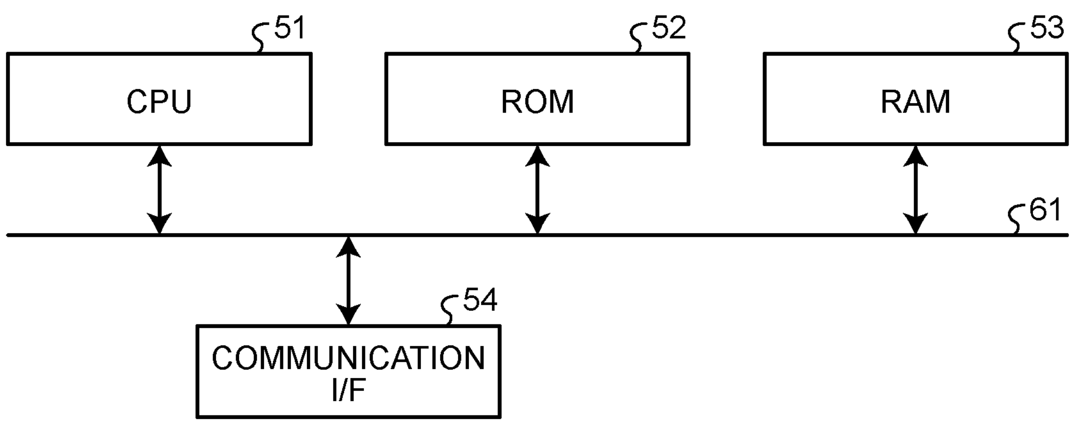
FIG. 12 is a hardware configuration diagram of an information processing device according to the present embodiment.

Next, the hardware configuration of the information processing device according to the present embodiment will be described with reference to FIG. 12. FIG. 12 is a diagram illustrating an example of the hardware configuration of the information processing device according to the present embodiment.

The information processing device according to the present embodiment includes a control device such as a CPU 51, memory devices such as a read only memory (ROM) 52 and a RAM 53, a communication I/F 54 that is connected to a network for performing communication, and a bus 61 that connects each of the units.

The computer program to be executed by the information processing device according to the present embodiment is provided by being loaded in advance in the ROM 52 or the like.

The computer program to be executed by the information processing device according to the present embodiment may be recorded in an installable or executable format file on a computer readable recording medium such as a compact disc read only memory (CD-ROM), a flexible disk (FD), a compact disc recordable (CD-R), or a digital versatile disc (DVD), and may be provided as a computer program product.

Furthermore, the computer program to be executed by the information processing device according to the present embodiment may be stored on a computer connected to a network such as the Internet and may be provided by being downloaded via the network. The computer program executed by the information processing device according to the present embodiment may be provided or distributed via a network such as the Internet.

The computer program executed by the information processing device according to the present embodiment may cause the computer to function as each of the units of the information processing device described above. As for the computer, the CPU 51 can read the computer program from a computer-readable storage medium and execute it on the main memory.

Configuration Examples of the embodiment are described below:

Configuration Example 1

An information processing device comprising
a processing unit configured to:
- analyze operation data of a battery and calculate feature information indicating a feature of charging/discharging by the battery;
- select, in accordance with the feature information, an estimation method among a plurality of estimation methods for estimating a state of the battery from the operation data; and
- estimate the state from the operation data using the selected estimation method.

Configuration Example 2

The information processing device according to Configuration Example 1, wherein
- the operation data is time series data including measurement time, voltage, and current, and
- the processing unit is configured to calculate, as the feature information, part of or all of: a mean ratio that is a ratio of a charging C-rate mean value that is a mean of C-rates during charging to a discharging C-rate mean value that is a mean of the C-rates during discharging, the C-rates being obtained by normalizing, by a rated power value, power values calculated by multiplying the voltage and the current; a data number ratio that is a ratio of a charging data number as a number of pieces of data of the C-rates during charging to a discharging data number as a number of pieces of data of the C-rates during discharging; and a switching ratio obtained by dividing a number of switchings between charging and discharging by a number of pieces of the operation data.

Configuration Example 3

The information processing device according to Configuration Example 2, wherein the plurality of estimation methods include a first estimation method that estimates the state using magnitude of fluctuation in the voltage, and the processing unit is configured to:

calculate the feature information including the switching ratio; and select the first estimation method, when the switching ratio is greater than a first threshold.

Configuration Example 4

The information processing device according to Configuration Example 2, wherein the plurality of estimation methods include a second estimation method that estimates the state using a difference between a mean value of the voltage during charging and a mean value of the voltage during discharging, and the processing unit is configured to:

calculate the feature information including the mean ratio, the data number ratio, and the switching ratio; and select the second estimation method, when the switching ratio is equal to or less than a first threshold, the data number ratio is outside a first specified range, and the mean ratio is outside a second specified range.

Configuration Example 5

The information processing device according to Configuration Example 2, wherein the plurality of estimation methods include a third estimation method that estimates the state using a mean value of fluctuation in the voltage, and the processing unit is configured to:

calculate the feature information including the mean ratio, the data number ratio, and the switching ratio; and select the third estimation method, when the switching ratio is equal to or less than a first threshold, and the data number ratio is outside a first specified range or the mean ratio is outside a second specified range.

Configuration Example 6

The information processing device according to any one of Configuration Examples 1 to 5, wherein the operation data is time series data including measurement time, voltage, and current, and the processing unit is configured to:

calculate C-rates by normalizing, by a rated power value, power values calculated by multiplying the voltage and the current; store the operation data in a storage unit when a C-rate ratio that is a ratio of a sum of the C-rates during charging to a sum of the C-rates during discharging is outside a third specified range; and analyze the operation data stored in the storage unit and calculate the feature information when the C-rate ratio is within the third specified range.

Configuration Example 7

The information processing device according to any one of Configuration Examples 1 to 6, wherein the processing unit is configured to output notification information indicating that no estimation method exists corresponding to the feature information, when none of the plurality of estimation methods is selected corresponding to the feature information.

Configuration Example 8

The information processing device according to any one of Configuration Examples 1 to 7, wherein the processing unit is configured to output information including at least part of: a number of times charging/discharging is performed in a period where the state is estimated; a mean power rate in the period; a representative temperature in the period; a charging/discharging efficiency of the battery; the selected estimation method; and information indicating a feature of a system that uses the battery, and including the estimated state.

Configuration Example 9

The information processing device according to any one of Configuration Examples 1 to 8, wherein the processing unit comprises:

a calculation unit configured to calculate the feature information;

a selection unit configured to select the estimation method; and an estimation unit configured to estimate the state from the operation data.

Configuration Example 10

An information processing method executed by an information processing device, the information processing method comprising:

analyzing operation data of a battery and calculating feature information indicating a feature of charging/discharging by the battery;

selecting, in accordance with the feature information, an estimation method among a plurality of estimation methods for estimating a state of the battery from the operation data; and estimating the state from the operation data using the selected estimation method.

Configuration Example 11

A computer program causing a computer to execute:

analyzing operation data of a battery and calculating feature information indicating a feature of charging/discharging by the battery;

selecting, in accordance with the feature information, an estimation method among a plurality of estimation methods for estimating a state of the battery from the operation data; and estimating the state from the operation data using the selected estimation method.

Configuration Example 12

An information processing system comprising:

a battery; and a processing unit configured to:

analyze operation data of the battery and calculate feature information indicating a feature of charging/discharging by the battery;

select, in accordance with the feature information, an estimation method among a plurality of estimation methods for estimating a state of the battery from the operation data; and estimate the state from the operation data using the selected estimation method.

While a certain embodiment has been described, this embodiment has been presented by way of example only, and are not intended to limit the scope of the inventions. Indeed, the novel embodiment described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An information processing device comprising one or more processors configured to:

obtain, via a network linked to a monitoring unit of a battery, operation data of the battery, the operation data being measured by the monitoring unit;

analyze the operation data and calculate feature information indicating a feature of charging/discharging by the battery;

select, in accordance with the feature information, an estimation method among a plurality of estimation methods for estimating a state of the battery from the operation data;

estimate the state from the operation data using the selected estimation method; and output, to a monitoring system, state information indicating the estimated state of the battery, the monitoring system monitoring and controlling operation of the battery based on the state information, wherein the operation data is time series data including measurement time, voltage, and current, the feature information includes: a mean ratio that is a ratio of a charging C-rate mean value that is a mean of C-rates during charging to a discharging C-rate mean value that is a mean of the C-rates during discharging, the C-rates being obtained by normalizing, by a rated power value, power values calculated by multiplying the voltage and the current; a data number ratio that is a ratio of a charging data number as a number of pieces of data of the C-rates during charging to a discharging data number as a number of pieces of data of the C-rates during discharging; and a switching ratio obtained by dividing a number of switchings between charging and discharging by a number of pieces of the operation data, the plurality of estimation methods include a first estimation method that estimates the state using magnitude of fluctuation in the voltage, a second estimation method that estimates the state using a difference between a mean value of the voltage during charging and a mean value of the voltage during discharging, and a third estimation method that estimates the state using a mean value of fluctuation in the voltage, and the one or more processors are configured to:

select the first estimation method, when the switching ratio is greater than a first threshold, select the second estimation method, when the switching ratio is equal to or less than the first threshold, the data number ratio is outside a first specified range, and the mean ratio is outside a second specified range, and select the third estimation method, when the switching ratio is equal to or less than the first threshold, and the data number ratio is outside a within the first specified range or the mean ratio is outside a within the second specified range.

2. The device according to claim 1, wherein the one or more processors are configured to:

calculate C-rates by normalizing, by a rated power value, power values calculated by multiplying the voltage and the current; store the operation data in a storage when a C-rate ratio that is a ratio of a sum of the C-rates during charging to a sum of the C-rates during discharging is outside a third specified range; and analyze the operation data stored in the storage and calculate the feature information when the C-rate ratio is within the third specified range.

3. The device according to claim 1, wherein the one or more processors are configured to output notification information indicating that no estimation method exists corresponding to the feature information, when none of the plurality of estimation methods is selected corresponding to the feature information.

4. The device according to claim 1, wherein the one or more processors are configured to output information including at least part of: a number of times charging/discharging is performed in a period where the state is estimated; a mean power rate in the period; a representative temperature in the period; a charging/discharging efficiency of the battery; the selected estimation method; and information indicating a feature of a system that uses the battery, and including the estimated state.

5. The device according to claim 1, wherein the one or more processors are configured to implement:

a calculation unit configured to calculate the feature information;

a selection unit configured to select the estimation method; and an estimation unit configured to estimate the state from the operation data.

6. An information processing method executed by an information processing device, the information processing method comprising:

measuring, by a monitoring unit of a battery, operation data of a battery;

analyzing the operation data and calculating feature information indicating a feature of charging/discharging by the battery;

selecting, in accordance with the feature information, an estimation method among a plurality of estimation methods for estimating a state of the battery from the operation data;

estimating the state from the operation data using the selected estimation method;

outputting, to a monitoring system, state information indicating the estimated state of the battery, the monitoring system monitoring and controlling operation of the battery based on the state information, wherein the operation data is time series data including measurement time, voltage, and current, the feature information includes: a mean ratio that is a ratio of a charging C-rate mean value that is a mean of C-rates during charging to a discharging C-rate mean value that is a mean of the C-rates during discharging, the C-rates being obtained by normalizing, by a rated power value, power values calculated by multiplying the voltage and the current; a data number ratio that is a ratio of a charging data number as a number of pieces of data of the C-rates during charging to a discharging data number as a number of pieces of data of the C-rates during discharging; and a switching ratio obtained by dividing a number of switchings between charging and discharging by a number of pieces of the operation data, the plurality of estimation methods include a first estimation method that estimates the state using magnitude of fluctuation in the voltage, a second estimation method that estimates the state using a difference between a mean value of the voltage during charging and a mean value of the voltage during discharging, and a third estimation method that estimates the state using a mean value of fluctuation in the voltage, and the selecting includes:

selecting the first estimation method, when the switching ratio is greater than a first threshold, selecting the second estimation method, when the switching ratio is equal to or less than the first threshold, the data number ratio is outside a first specified range, and the mean ratio is outside a second specified range, and selecting the third estimation method, when the switching ratio is equal to or less than the first threshold, and the data number ratio is outside a within the first specified range or the mean ratio is outside a within the second specified range.

7. The method according to claim 6, further comprising:

measuring, by the monitoring unit of the battery, at least a voltage output of the battery and at least one of a current output or a power output of the battery.

8. The method according to claim 6, wherein the selecting and estimating are performed such that a state of health is continuously monitored on a unit of a battery component by tracking a history even when a usage or configuration of a battery system changes, without explicitly designating a change of the usage.

9. A computer program product comprising a non-transitory computer-readable medium including programmed instructions, the instructions causing a computer to execute:

obtaining, via a network linked to a monitoring unit of a battery, operation data of the battery, the operation data being measured by the monitoring unit;

analyzing the operation data and calculating feature information indicating a feature of charging/discharging by the battery;

selecting, in accordance with the feature information, an estimation method among a plurality of estimation methods for estimating a state of the battery from the operation data;

estimating the state from the operation data using the selected estimation method; and outputting, to a monitoring system, state information indicating the estimated state of the battery, the monitoring system monitoring and controlling operation of the battery based on the state information, wherein the operation data is time series data including measurement time, voltage, and current, the feature information includes: a mean ratio that is a ratio of a charging C-rate mean value that is a mean of C-rates during charging to a discharging C-rate mean value that is a mean of the C-rates during discharging, the C-rates being obtained by normalizing, by a rated power value, power values calculated by multiplying the voltage and the current; a data number ratio that is a ratio of a charging data number as a number of pieces of data of the C-rates during charging to a discharging data number as a number of pieces of data of the C-rates during discharging; and a switching ratio obtained by dividing a number of switchings between charging and discharging by a number of pieces of the operation data, the plurality of estimation methods include a first estimation method that estimates the state using magnitude of fluctuation in the voltage, a second estimation method that estimates the state using a difference between a mean value of the voltage during charging and a mean value of the voltage during discharging, and a third estimation method that estimates the state using a mean value of fluctuation in the voltage, and the selecting includes:

selecting the first estimation method, when the switching ratio is greater than a first threshold, selecting the second estimation method, when the switching ratio is equal to or less than the first threshold, the data number ratio is outside a first specified range, and the mean ratio is outside a second specified range, and selecting the third estimation method, when the switching ratio is equal to or less than the first threshold, and the data number ratio is outside a within the first specified range or the mean ratio is outside a within the second specified range.

10. The computer program product according to claim 9, wherein the monitoring unit of the battery measures at least a voltage output of the battery and at least one of a current output or a power output of the battery.

11. The computer program product according to claim 9, wherein the selecting and estimating are performed such that a state of health is continuously monitored on a unit of a battery component by tracking a history even when a usage or configuration of a battery system changes, without explicitly designating a change of the usage.

12. An information processing system comprising:

a battery;

a monitoring unit measuring operation data of the battery;

a monitoring system monitoring and controlling operation of the battery; and one or more processors configured to:

obtain, via a network linked to the monitoring unit, the operation data of the battery;

analyze the operation data and calculate feature information indicating a feature of charging/discharging by the battery;

select, in accordance with the feature information, an estimation method among a plurality of estimation methods for estimating a state of the battery from the operation data;

estimate the state from the operation data using the selected estimation method; and output, to the monitoring system, state information indicating the estimated state of the battery, the monitoring system monitoring and controlling the operation of the battery based on the state information, wherein the operation data is time series data including measurement time, voltage, and current, the feature information includes: a mean ratio that is a ratio of a charging C-rate mean value that is a mean of C-rates during charging to a discharging C-rate mean value that is a mean of the C-rates during discharging, the C-rates being obtained by normalizing, by a rated power value, power values calculated by multiplying the voltage and the current; a data number ratio that is a ratio of a charging data number as a number of pieces of data of the C-rates during charging to a discharging data number as a number of pieces of data of the C-rates during discharging; and a switching ratio obtained by dividing a number of switchings between charging and discharging by a number of pieces of the operation data, the plurality of estimation methods include a first estimation method that estimates the state using magnitude of fluctuation in the voltage, a second estimation method that estimates the state using a difference between a mean value of the voltage during charging and a mean value of the voltage during discharging, and a third estimation method that estimates the state using a mean value of fluctuation in the voltage, and the one or more processors are configured to:

select the first estimation method, when the switching ratio is greater than a first threshold, select the second estimation method, when the switching ratio is equal to or less than the first threshold, the data number ratio is outside a first specified range, and the mean ratio is outside a second specified range, and select the third estimation method, when the switching ratio is equal to or less than the first threshold, and the data number ratio is within the first specified range or the mean ratio is within the second specified range.

13. The device according to claim 1, wherein the monitoring unit of the battery measures at least a voltage output of the battery and at least one of a current output or a power output of the battery.

14. The device according to claim 1, wherein the selecting and estimating are performed such that a state of health is continuously monitored on a unit of a battery component by tracking a history even when a usage or configuration of a battery system changes, without explicitly designating a change of the usage.

15. The information processing system according to claim 12, wherein the monitoring unit measures at least a voltage output of the battery and at least one of a current output or a power output of the battery.

16. The information processing system according to claim 12, wherein the selecting and estimating are performed such that a state of health is continuously monitored on a unit of a battery component by tracking a history even when a usage or configuration of a battery system changes, without explicitly designating a change of the usage.

* * * * *